(12) United States Patent
Chakraborty et al.

(10) Patent No.: US 8,014,616 B2
(45) Date of Patent: Sep. 6, 2011

(54) SYSTEM AND METHOD FOR FIXED POINT CONTINUATION FOR TOTAL VARIATION BASED COMPRESSED SENSING IMAGING

(75) Inventors: Amit Chakraborty, East Windsor, NJ (US); Wotao Yin, Houston, TX (US); Shiqian Ma, New York, NY (US)

(73) Assignee: Siemens Aktiengesellschaft, Munich (DE)

( * ) Notice: Subject to any disclaimer, the term of this patent is extended or adjusted under 35 U.S.C. 154(b) by 570 days.

(21) Appl. No.: 12/259,360

(22) Filed: Oct. 28, 2008

(65) Prior Publication Data

US 2009/0141995 A1    Jun. 4, 2009

Related U.S. Application Data

(60) Provisional application No. 60/984,771, filed on Nov. 2, 2007.

(51) Int. Cl.
*G06K 9/36* (2006.01)
*G06K 9/46* (2006.01)

(52) U.S. Cl. ..................................... 382/233
(58) Field of Classification Search .................. None
See application file for complete search history.

(56) References Cited

U.S. PATENT DOCUMENTS 7,271,747 B2 *  9/2007  Baraniuk et al. ................ 341/87
7,289,049 B1 * 10/2007  Fudge et al. .................... 341/123
7,345,603 B1 *  3/2008  Wood et al. .................... 341/122
7,450,032 B1 * 11/2008  Cormode et al. ............... 341/50
7,532,772 B2 *  5/2009  Brady .............................. 382/299
7,834,795 B1 * 11/2010  Dudgeon et al. ............... 341/155

OTHER PUBLICATIONS

Elaine T. Hale, et al,, "A Fixed-Point Continuation Method for $\Lambda_1$-Regularized Minimization with Applications to Compressed Sensing" CAAM Technical Report TR07-07, Rice University, Houston 2007.

* cited by examiner

*Primary Examiner* — Yuzhen Ge

(57) ABSTRACT

A method of compressed sensing imaging includes acquiring a sparse digital image b, said image comprising a plurality of intensities corresponding to an I-dimensional grid of points, initializing points $(x^{(k)}, y^{(k)})$, wherein $x^{(k)}$ is an element of a first expanded image $\bar{x}$ defined by $b = R\Phi^{-1}\bar{x}$, wherein R is a Fourier transform matrix, $\Phi$ is a wavelet transform matrix, $y^{(k)}$ is a point in $$\partial\left(\sum_{i=1}^{l}(\nabla_i\Phi^{-1}x^{(k)})^2\right)^{1/2},$$

$\nabla_i$ is a forward finite difference operator for a $i^{th}$ coordinate, and k is an iteration counter; calculating a first auxiliary variable $s^{(k)}$ from $$x^{(k)} - \tau_1\left(\alpha\Phi\sum_n L_n^* y_n^{(k)} + \Phi R*(R\Phi^{-1}x^{(k)} - b)\right),$$

wherein $\tau_1, \alpha$ are predetermined positive scalar constants, the sum is over all points n in $\bar{x}$, and L* is an adjoint of operator $L = (\nabla_1, \ldots, \nabla_l)$; calculating a second auxiliary variable $t_n^{(k)}$ from $y_n^{(k)} + \tau_2 L_n \Phi^{-1} x^{(k)}$, wherein $\tau_2$ is a predetermined positive scalar constant; updating $x^{(k+1)}$ from sign$(s^{(k)})$max$\{0, |s^{(k)}| - \tau_1 \beta\}$, wherein $\beta$ is a predetermined positive scalar constant; and updating $y_n^{(k+1)}$ from $$\min\left\{\frac{1}{\tau_2}, \|t_n^{(k)}\|_2\right\}\frac{t_n^{(k)}}{\|t_n^{(k)}\|_2}.$$

18 Claims, 9 Drawing Sheets

| $\sigma$ | 0 | 1e-4 | 1e-3 | 1e-2 | 1e-1 |
|---|---|---|---|---|---|
| *rel.err.* | 1.201e-2 | 1.201e-2 | 1.201e-2 | 1.217e-2 | 3.755e-2 |
| Time(sec) | 4.30 | 4.38 | 4.38 | 4.39 | 4.36 |

Figure 4: Table 1

| | | TVCMRI | | FPC | |
|---|---|---|---|---|---|
| Image | Samp.Ratio | Rel.Err. | Time(sec) | Rel.Err. | Time(sec) |
| Renal | 38.50% | 3.335e-2 | 3.27 | 3.779e-2 | 22.23 |
| Arteries | 21.53% | 8.738e-2 | 3.33 | 1.147e-1 | 42.94 |
| 220 × 220 | 8.81% | 2.141e-1 | 3.11 | 3.054e-1 | 47.72 |
| Abdomen | 38.41% | 6.469e-2 | 5.30 | 9.010e-2 | 53.63 |
| Extremities | 21.45% | 1.751e-1 | 5.81 | 2.806e-1 | 60.28 |
| 480 × 150 | 8.51% | 4.119e-1 | 5.92 | 5.380e-1 | 74.30 |
| Human | 38.29% | 6.093e-2 | 14.53 | 7.052e-2 | 155.92 |
| Full Body | 21.42% | 1.565e-1 | 14.14 | 2.276e-1 | 209.25 |
| 924 × 208 | 8.28% | 4.269e-1 | 14.39 | 5.454e-1 | 199.08 |

Figure 8: Table 2

SYSTEM AND METHOD FOR FIXED POINT CONTINUATION FOR TOTAL VARIATION BASED COMPRESSED SENSING IMAGING

CROSS REFERENCE TO RELATED UNITED STATES APPLICATIONS

This application claims priority from "Solving Total Variation-based Compressed Sensing of Magnetic Resonance Images Using a Fixed Point Continuation Method", Provisional Application No. 60/984,771 of Chakraborty, et al., filed Nov. 2, 2007, the contents of which are herein incorporated by reference in their entireties.

TECHNICAL FIELD

This disclosure is directed to compressed sensing reconstruction of digitized medical images.

DISCUSSION OF THE RELATED ART

Imaging plays an important role today in medical diagnosis. In particular, the use of Magnetic Resonance Imaging (MRI) is crucial for understanding soft tissue changes within the body in a non-invasive manner. Its use of nonionizing radio frequency emission for image acquisition is considered safe for repeated use in a clinical setting. Consequently, it has become a modality of choice for a variety of medical practitioners, such as neuro-radiologists, cardiologists and oncologists. Typically, energy from an RF pulse is directed to a small section of the targeted anatomy at a time. When this happens, the protons within that area are forced to spin in a certain frequency and become aligned to the direction of the magnet. On turning off the signal, the physical system returns to its natural state and releases the energy, which is consequently captured and sent for analysis. This is repeated to acquire information for the entire targeted region which is then subsequently analyzed. This data, acquired in the frequency domain (also called k-space), is then inverted through the use of the Inverse Discrete Fourier Transform to arrive at an image of the anatomy under consideration.

Given that the Fourier transformation is a linear mapping, the number of samples necessary to image an anatomical area is directly proportional to its size. Further, given that the frequency domain information is acquired in a primarily sequential manner, even though parallel imaging techniques such as SENSE and GRAPPA are available, the time needed for imaging is proportional to the size of the object scanned. During scanning, the subject should be restrained from moving as otherwise motion artifacts can degrade the quality of the acquired images. Even normal breathing can be a problem. Hence, subjects are often either physically restrained or sedated when large complex anatomical regions, such as the brain, are imaged.

Thus, the adoption of MRI to new clinical applications and even its use for accepted procedures can be enhanced by reducing the time needed for imaging. From the above discussion, that would mean acquiring fewer samples in the frequency domain. It seems that this however, would directly violate the long established Nyquist criterion: the amount of acquisition must at least match the amount of information needed for recovery, which means perfect reconstruction would not be possible, and hence the acquired images will demonstrate the so called Gibbs aliasing.

Consequently, faster scanning techniques have garnered significant research interest. One particular technology that was used initially was that of Echo planar imaging that uses special purpose hardware to gather information for the entire k-space using a single RF cycle as opposed to the multiple cycle approach discussed earlier. The drawback of this approach, besides the hardware requirement, is that the signal strength is significantly compromised and hence has limited medical use. Another option is to exploit the problem structure. Since, the images acquired are real (as opposed to being complex), Fourier theory suggests that the k-space is symmetric. Hence half the measurements can be inferred. However, motion artifacts and other distortions can limit the applicability of this and the actual savings are often limited to less than half of the Nyquist criterion.

Compressed sensing algorithms, on the other hand exploit the inherent redundancies in medical images, such as intra-organ smoothness, to limit the required measurements for acceptable reconstruction without the associated artifacts. Unlike the methods discussed earlier, as indicated previously, only about 20% or less of the measurements are sufficient for faithful reconstruction. Further, in applications such as Dynamic cardiac MR imaging where the goal is to study the functional characteristics (not just the anatomical details), compressed sensing techniques can be a major enabler.

Compressed sensing is a new area of research which has gained popularity due to its ability to reconstruct perfect signals from a limited number of samples by taking advantage of the sparse nature of the signals in a transform domain. In the case of MR images, being able to reconstruct images with high quality with a subset of the samples from k-space means spending less time in the magnet for the patient. This has consequences for the patient, who is now more receptive to the procedure, and for the care giver and owner of the clinic, whose throughput can now be increased.

Compressed sensing for imaging in general is based upon the fact that most images are compressible. Let the vector $\bar{u}$ represent an image. A compression algorithm such as JPEG2000 compresses the image by finding some dictionary $\Phi$, such as Fourier or wavelet bases, such that $\Phi\bar{u}=\bar{x}$ is (approximately) sparse, and saving the locations and values of the nonzero entries of $\bar{x}$. To recover $\bar{u}$, one simply uses the same dictionary and sets $\bar{u}=\Phi^{-1}\bar{x}$. For ease of notation, let $k=\|\bar{x}\|_0$ be the number of nonzeros in $\bar{x}$ and n denote the dimension of $\bar{x}$.

The process of compressed sensing includes three steps: encoding, sensing, and decoding. In a first step, $\bar{u}$ is encoded into a smaller vector $b=R\bar{u}$ of a size m<n by a linear transform R. Clearly, b contains less information than $\bar{u}$, so it is a compression of $\bar{u}$. Since $\bar{u}=\Phi^{-1}\bar{x}$, $b=A\bar{x}$ (for $A=R\Phi^{-1}$) is also a compression of $\bar{x}$. In many applications of compressed sensing, the linear transform R is not calculated by a computer but obtained by certain physical or digital means. In MRI, for example, R represents a partial discrete Fourier transform, where it is "partial" because $R\bar{u}$ only gives the Fourier coefficients corresponding to an incomplete set of frequencies. Notice that since $\bar{u}$ is unknown during this step, R can only be chosen independently (non-adaptively) of $\bar{u}$. In a second step, b is acquired (by coils in an MRI scanner) and sent to a computer. A third step is to recover $\bar{x}$ (and thus, $\bar{u}$) from b. Since $\bar{x}$ is sparse, it can be found as the sparsest solution to the underdetermined equations $Ax=b$ unless there exists another even sparser solution to these equations. This gives rise to an $l_0$-system: $\min_x\{\|x\|_0 : Ax=b\}$. However, this system is NP-hard and impractical for nearly all real applications, so it is more realistic to solve a computationally tractable alternative such as an $l_1$-system:

$$\min_x\{\|x\|_1 : Ax=b\}, \qquad (1)$$

which has also been known to yield sparse solutions under some conditions. Ideally, one would like to take the least possible number of measurements, that is, m being equal to k. However, one must pay a price for not knowing the locations of the nonzeros in $\bar{x}$ while still asking for perfect reconstructions of most sparse $\bar{x}$. It has been shown that, when R is Gaussian random and partial Fourier (as in the MRI case), EQ. (1) can recover $\bar{x}$ with (technically with a high probability) from b of a size m=O(k log(n/k)) and O(k log(n)$^4$), respectively. These sample sizes m are larger than k but still much smaller than n. Finally, once $\bar{x}$ is recovered, $\bar{u}$ becomes available through $\bar{u}=\Phi^{-1}\bar{x}$.

The exact recovery of $\bar{u}$ by the model represented by EQ. (1) requires the assumptions that $\bar{x}$ is sparse and b equals $A\bar{x}$ exactly. In practice, especially in imaging, it is often the case that $\bar{x}$ is only approximately sparse, that is, $\bar{x}$ contains a small number of components with magnitudes significantly larger than those of the rest, which are not necessarily zero. In some applications, it is also the case that the measurements b are contaminated with noise n, i.e., b=$A\bar{x}$+n. In both cases, an appropriate relaxation of b=Ax should be considered. The topic of compressed sensing stability studies how accurately a model can recover signals under the above conditions.

There are stability results established for the model EQ. (1) and its extension $$\min_{x}\{\|x\|_1 : \|Ax-b\|_2^2 \leq \sigma^2\}. \quad (2)$$

The solution x* of EQ. (2), with measurements similar to the exact recovery case, satisfies $$\|x^*-\bar{x}\|_2 \leq O(\sigma+k^{1/2}\|\bar{x}-\bar{x}(k)\|_1), \quad (3)$$

where $\bar{x}$ is approximately k-sparse and $\bar{x}$ (k) is the k-approximation to $\bar{x}$ by zeroing the n-k insignificant components. Thus, if $\bar{x}$ is exactly k-sparse and $\sigma$ is set to 0, then EQ. (3) reduces to the exact recovery of x*=$\bar{x}$.

Solving EQ. (2) is equivalent to solving the simpler Lagrange relaxation equation $$\min_{x}\left(\mu\|x\|_1 + \frac{1}{2}\|Ax-b\|_2^2\right). \quad (4)$$

This equivalence is in the sense that solving one of the two problems will determine the parameter in the other such that both give the same solution. Given the data A, b, and $\sigma$ in EQ. (2), there exist practical ways to estimate an appropriate $\mu$ in EQ. (4).

To recover an MR image from undersampled Fourier measurements b, one could solve EQ. (4) with $$A=R\Phi^{-1}, \quad (5)$$

with R being a partial Fourier transform and $\Phi$ being a wavelet transform; however, to get the most out of b, one should also exploit the fact that MR images of organs are expected to demonstrate piecewise continuous behavior, i.e. different anatomical structures are supposed to show uniform characteristics. Such a signal has a small total variation, which is defined discretely as $$TV(u) := \sum_{ij}((\nabla_1 u_{ij})^2 + (\nabla_2 u_{ij})^2)^{1/2},$$

where $\nabla_1$ and $\nabla_2$ denote the forward finite difference operators on the first and second coordinates, respectively. To capture this, the total variation of $u=\Phi^{-1}x$ is minimized giving rise to the equation $$\min_{x} F(x) := \alpha TV(\Phi^{-1}x) + \beta\|x\|_1 + \frac{1}{2}\|Ax-b\|_2^2, \quad (6)$$

where $\alpha$ and $\beta$ are two positive parameters. However, because TV ($\Phi^{-1}x$) and $\|x\|_1$ are both nonsmooth in x, EQ. (6) is more challenging to solve than those with a single nonsmooth term such as EQ. (4) or a pure total variation regularization problem. Note that in variational imaging, it is easier to propose models than to solve them efficiently. For example, introducing a fourth-order regularization term to the objective function in EQ. (6) will certainly improve the quality of reconstructed images by enhancing the recovery of small-scale details, however, the resulting system is too complex to solve for real world MR images. Computation is the bottleneck that made EQ. (6) impractical in the past, and it still prevents models more complicated than EQ. (6) from being used.

SUMMARY OF THE INVENTION

Exemplary embodiments of the invention as described herein generally include methods and systems for efficiently reconstructing MR images from a limited set of measurements based on the compressed sensing theory by jointly minimizing an $l_1$ norm, a total variation, and a least squares measure using operator-splitting framework fixed point iterations. Calculations can be accelerated by continuation and takes advantage of fast wavelet and Fourier transforms to process MR images from actual real life applications. Numerical experiments on a synthetic Phantom image and real MR images show that an algorithm according to an embodiment of the invention can give a faithful recovery in less than 15 seconds even when the sampling ratio is relatively small. By comparing the relative errors of recovered images obtained by solving the underlying model and one without the total variation term, it is shown that the usage of total variation aids restoring MR image from compressed measurements. An algorithm according to an embodiment of the invention can be further accelerated by incorporating additional optimization techniques such as smoothing and more efficient line searches. Although embodiments of the invention presented herein operate on two dimensional images, these embodiments are exemplary and non-limiting, and one of skill in the art may easily extend theories and methods according to other embodiments of the invention to images in three or higher dimensions. Further, algorithms according to other embodiments of the invention may be extended to other imaging and vision applications in addition to MR images.

According to an aspect of the invention, there is provided a method for compressed sensing imaging, including acquiring a sparse digital image b, the image comprising a plurality of intensities corresponding to an I-dimensional grid of points, initializing points $(x^{(k)}, y^{(k)})$, where $x^{(k)}$ is an element of a first expanded image $\bar{x}$ defined by $b=R\Phi^{-1}\bar{x}$, where R is a Fourier transform matrix, $\Phi$ is a wavelet transform matrix, $y^{(k)}$ is a point in $$\partial\left(\sum_{i=1}^{I}(\nabla_i\Phi^{-1}x^{(k)})^2\right)^{1/2},$$

$\nabla_i$ is a forward finite difference operator for a $i^{th}$ coordinate, and k is an iteration counter, calculating a first auxiliary variable $s^{(k)}$ from $$x^{(k)} - \tau_1\left(\alpha\Phi\sum_n L_n^* y_n^{(k)} + \Phi R^*(R\Phi^{-1}x^{(k)} - b)\right),$$

where $\tau_1, \alpha$ are predetermined positive scalar constants, the sum is over all points n in $\bar{x}$, and $L^*$ is an adjoint of operator $L=(\nabla_1, \ldots, \nabla_I)$, calculating a second auxiliary variable $t_n^{(k)}$ from $y_n^{(k)} + \tau_2 L_n \Phi^{-1} x^{(k)}$, where $\tau_2$ is a predetermined positive scalar constant, updating $x^{(k+1)}$ from $\text{sign}(s^{(k)}) \max\{0, |s^{(k)}| - \tau_1\beta\}$, where $\beta$ is a predetermined positive scalar constant; and updating $y_n^{(k+1)}$ from $$\min\left\{\frac{1}{\tau_2}, \|t_n^{(k)}\|_2\right\} \frac{t_n^{(k)}}{\|t_n^{(k)}\|_2}.$$

According to a further aspect of the invention, the steps of calculating a first auxiliary variable $s^{(k)}$, calculating a second auxiliary variable $t_n^{(k)}$, updating $x^{(k+1)}$, and updating $y_n^{(k+1)}$ are repeated until convergence.

According to a further aspect of the invention, the wavelet transform matrix $\Phi$ is a Haar wavelet transform matrix.

According to a further aspect of the invention, the Fourier transform matrix R is a non-invertible matrix of size m×n, where m is a number of points in image b, n is a number of points in first expanded image $\bar{x}$, and m<<n.

According to a further aspect of the invention, the m rows of R are selected by sampling more points in Fourier space near bottom corners in the Fourier space, and fewer points approaching a center of the Fourier space, where an upper half space is masked.

According to a further aspect of the invention, the method includes constructing a second expanded digitized image $\bar{u}$ from $\bar{u} = \Phi^{-1}\bar{x}$.

According to a further aspect of the invention, the method includes updating the positive, scalar constants $\alpha, \beta$ from $\alpha_{k+1} = \alpha_k \eta_\alpha$ and $\beta_{k+1} = \beta_k \eta_\beta$, where $\eta_\alpha$ and $\eta_\beta$ are predetermined positive, scalar constants, and repeating the steps of calculating a first auxiliary variable $s^{(k)}$, calculating a second auxiliary variable $t_n^{(k)}$, updating $x^{(k+1)}$, and updating $y_n^{(k+1)}$ until convergence.

According to a further aspect of the invention, the method includes updating the positive, scalar constants $\alpha, \beta$ until $\alpha, \beta$ reach predetermined minimum values.

According to another aspect of the invention, there is provided a method of compressed sensing imaging including the steps of acquiring a sparse digital image b, the image comprising a plurality of intensities corresponding to an I-dimensional grid of points, providing a wavelet transform matrix $\Phi$, providing a non-invertible Fourier transform matrix R of size m×n, where m is a number of points in image b, n is a number of points in a first expanded image x defined by $b = R\Phi^{-1}x$, and m<<n, jointly minimizing an $l_1$ norm, a total variation, and a least squares measure $$\min_x \left(\alpha TV(\Phi^{-1}x) + \beta\|x\|_1 + \frac{1}{2}\|Ax - b\|_2^2\right)$$

to solve for x using operator-splitting fixed point iterations, where x is the first expanded image, $A = R\Phi^{-1}$, $\alpha$ and $\beta$ are predefined positive parameters, $$TV(u) := \sum_n \left(\sum_i (\nabla_i u)^2\right)^{1/2}$$

is a total variation of $\Phi^{-1}x$, where the outer sum is over all points in x, the inner sum is over all dimensions, $\nabla_i$ denotes the forward finite difference operators on the $i^{th}$ coordinate, and constructing a second expanded digitized image u from $u = \Phi^{-1}x$.

According to a further aspect of the invention, the operator-splitting fixed point iterations comprise the steps of initializing points $(x^{(k)}, y^{(k)})$, where $x^{(k)}$ is an element of the first expanded image $\bar{x}$, $y^{(k)}$ is a point in $$\partial\left(\sum_{i=1}^l (\nabla_i \Phi^{-1} x^{(k)})^2\right)^{1/2},$$

and k is an iteration counter. calculating a first auxiliary variable $s^{(k)}$ from $$x^{(k)} - \tau_1\left(\alpha\Phi\sum_n L_n^* y_n^{(k)} + \Phi R*(R\Phi^{-1}x^{(k)} - b)\right),$$

where $\tau_1, \alpha$ are predetermined positive scalar constants, the sum is over all points n in $\bar{x}$, and $L^*$ is an adjoint of operator $L = (\nabla_1, \ldots, \nabla_I)$, calculating a second auxiliary variable $t_n^{(k)}$ from $y_n^{(k)} + \tau_2 L_n \Phi^{-1} x^{(k)}$, where $\tau_2$ is a predetermined positive scalar constant, updating $x^{(k+1)}$ from $\text{sign}(s^{(k)}) \max\{0, |s^{(k)}| - \tau_1\beta\}$, where $\beta$ is a predetermined positive scalar constant, and updating $y_n^{(k+1)}$ from $$\min\left\{\frac{1}{\tau_2}, \|t_n^{(k)}\|_2\right\} \frac{t_n^{(k)}}{\|t_n^{(k)}\|_2}.$$

According to an aspect of the invention, there is provided a program storage device readable by a computer, tangibly embodying a program of instructions executable by the computer to perform the method steps for compressed sensing imaging.

BRIEF DESCRIPTION OF THE DRAWINGS

FIG. 4 is a table of numerical results for a Phantom image with different noise levels, according to an embodiment of the invention.

FIG. 8 is a table of numerical results for different MR images with different sampling ratios, according to an embodiment of the invention.

DETAILED DESCRIPTION OF EXEMPLARY EMBODIMENTS

Figure 1:
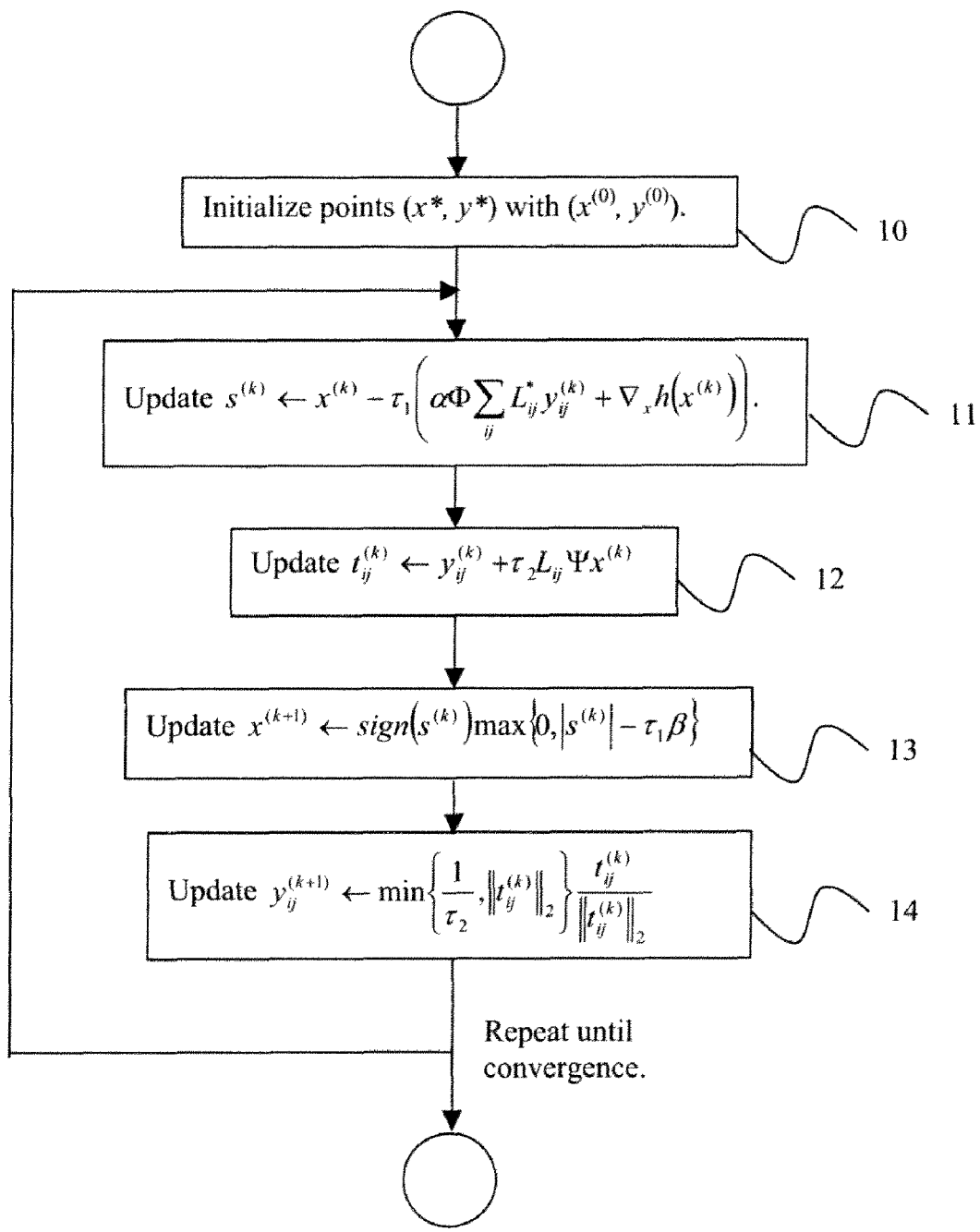
FIG. 1 is a flowchart of a method for compressed sensing reconstruction of magnetic resonance images, according to an embodiment of the invention.

Exemplary embodiments of the invention as described herein generally include systems and methods for compressed sensing reconstruction of magnetic resonance images. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

As used herein, the term "image" refers to multi-dimensional data composed of discrete image elements (e.g., pixels for 2-D images and voxels for 3-D images). The image may be, for example, a medical image of a subject collected by computer tomography, magnetic resonance imaging, ultrasound, or any other medical imaging system known to one of skill in the art. The image may also be provided from non-medical contexts, such as, for example, remote sensing systems, electron microscopy, etc. Although an image can be thought of as a function from $R^3$ to R, the methods of the inventions are not limited to such images, and can be applied to images of any dimension, e.g., a 2-D picture or a 3-D volume. For a 2- or 3-dimensional image, the domain of the image is typically a 2- or 3-dimensional rectangular array, wherein each pixel or voxel can be addressed with reference to a set of 2 or 3 mutually orthogonal axes. The terms "digital" and "digitized" as used herein will refer to images or volumes, as appropriate, in a digital or digitized format acquired via a digital acquisition system or via conversion from an analog image.

Optimality Conditions

For ease of notation, let $u \in R^{n_1 \times n_2}$ denote a 2D MR image of $n_1 \times n_2$ pixels and $L=(\nabla_1, \nabla_2): R^{n_1 \times n_2} \to R^{n_1 \times n_2} \times R^{n_1 \times n_2}$ denote the discrete finite difference operators along the first and second coordinates subject to appropriate boundary conditions. For pixel (i,j), define $L_{ij}u=(\nabla_1 u_{ij}, \nabla_2 u_{ij})$ and $f(z)=\|z\|_2$: $R^2 \to R$. This notation yields $$TV(u) = \sum_{ij} f(L_{ij}(u)),$$

where the summation is taken over all pixels with appropriate boundary conditions. In addition, let $$g(z) = \|z\|_1, \quad h(z) = \frac{1}{2}\|Az - b\|_2^2,$$

and $\Psi = \Phi^{-1}$, which equals the adjoint operator $\Phi^*$ of $\Phi$ for any orthonormal transform $\Phi$. Using the notation, EQ. (6) can be rewritten as $$\min_x E(x) := \alpha \sum_{ij} f(L(\Psi x)_{ij}) + \beta g(x) + h(x). \quad (7)$$

Since all the terms in EQ. (7) are convex and $\alpha, \beta > 0$, the objective function is convex; hence, the first-order optimality condition of EQ. (7) is $$0 \in \partial E(x^*), \quad (8)$$

where $$\partial E(x^*):=\{p:E(x)-E(x^*) \geq \langle p, x-x^* \rangle \forall x\}, \quad (9)$$

is the subdifferential (i.e., the set of subgradients) of E( ) at x*. When EQ. (8) is satisfied, it follows from the definition of EQ. (9) that $E(x) \geq E(x^*)$ for all x; hence, x* is a minimizer of EQ. (7).

Although solving EQ. (8) for x* is no simpler than EQ. (7), EQ. (8) is a starting point to derive an efficient iteration. First, expand $\partial E(x^*)$ to obtain $$0 \in \alpha \Phi \sum_{ij} L_{ij}^* \partial f(L_{ij}\Psi x^*) + \beta \partial g(x^*) + \nabla_x h(x^*). \quad (10)$$

Noticing that the first term on the right-hand side of EQ. (10) is complicated to compute, introduce an auxiliary variable $y^*_{ij} \in R^2$ to represent a point in $\partial f(L_{ij}\Psi x^*)$ for all i, j. As such, EQ. (10) can be rewritten as $$0 \in \alpha \Phi \sum_{ij} L_{ij}^* y_{ij}^* + \beta \partial g(x^*) + \nabla_x h(x^*), \quad (11)$$

for certain $y^*_{ij} \in \partial f(L_{ij}\Psi x^*)$. Next, apply the property $$y \in \partial f(x) \Leftrightarrow x \in \partial f^*(x), \quad (12)$$

to the convex function $f$ and its convex conjugate $$f*(y) := \sup_x \{\langle y, x \rangle - f(x)\} \quad (13)$$

to obtain the following result.

Theorem 2.1. x* is optimal if and only if there exists an auxiliary variable $y^*=(y^*_{ij})$ where $y_{ij} \in R^2$, such that $$0 \in \alpha \Phi \sum_{ij} L_{ij}^* y_{ij}^* + \beta \partial g(x^*) + \nabla_x h(x^*), \quad (14)$$

$$L_{ij}\Psi x^* \in \partial f^*(y^*_{ij}), \quad (15)$$

where $L^*_{ij}$ is the adjoint operator of $L_{ij}$ and $f^*$ is defined by EQ. (13).

The proof of Theorem 2.1 is clear from the derivation of EQS. (14) and (15). Although it is challenging to directly solve EQS. (14) and (15), an operator splitting method according to an embodiment of the invention can be applied to them with auxiliary variables s and t and two scalars $\tau_1, \tau_2 > 0$ obtaining:

$$EQ.(14) \Leftrightarrow 0 \epsilon \tau_1 \beta \partial g(x^*) + x^* - s, \quad (16)$$

$$s = x* - \tau_1 \left( \alpha \Phi \sum_{ij} L_{ij}^* y_{ij}^* + \nabla_x h(x*) \right), \quad (17)$$

where $$\nabla_x h(x^*) = A^*(Ax^* - b) = \Phi R^*(R\Psi x^* - b)$$

and $$EQ.(15) \Leftrightarrow 0 \epsilon \tau_2 \partial f^*(y^*_{ij}) + y^*_{ij} - t_{ij}, \quad (18)$$

$$t_{ij} = y^*_{ij} + \tau_2 L_{ij} \Psi x^*. \quad (19)$$

Now, EQS. (16) to (19) are easy to compute. Given x* and y*, EQS. (17) and (19) compute s and t, respectively, in a straightforward way. On the other hand, given s and t, EQS. (16) and (18) uniquely determine x* and y*, respectively, because EQ. (18) is the optimality condition of the strictly convex system $$\min_x \left( \tau_1 \beta \|x\|_1 + \frac{1}{2} \|x - s\|_2^2 \right), \quad (20)$$

and EQ. (18) is equivalent to (again, due to EQ. (12))

$$0 \epsilon \tau_2 y^*_{ij} + \partial f(y^*_{ij} - t_{ij}), \quad (21)$$

and thus is the optimality condition of $$\min_y \left( \frac{\tau_2}{2} \|y_{ij}\|_2^2 + \|y_{ij} - t_{ij}\|_2 \right). \quad (22)$$

Both EQS. (20) and (22) have closed-form solutions (proved in Theorem 2.2 below) to yield x* and y*, respectively:

$$x*(s) = \text{sign}(s)\max\{0, |s| - \tau_1 \beta\}, \quad (23)$$

$$y^*_{ij}(t_{ij}) = \min\left\{ \frac{1}{\tau_2}, \|t_{ij}\|_2 \right\} \frac{t_{ij}}{\|t_{ij}\|_2}, \quad (24)$$

where all operations in EQ. (23) are performed componentwise, and 0/0 is defined to be 0 in EQ. (24).

Therefore, according to an embodiment of the invention, EQS. (16)-(19) can be solved (hence, the original EQ. (7)) using a fixed-point iteration scheme, illustrated by the flowchart of FIG. 1. Referring to the figure, an iteration starts at step 10 by initializing (x*, y*) with a suitable $(x^{(0)}, y^{(0)})$. Then at step 11, $s^{(k)}$ is updated using EQ. (17) for $(x^*, y^*) = (x^{(k)}, y^{(k)})$. At step 12, $t^{(k)}$ is updated using EQ. (19) for $(x^*, y^*) = (x^{(k)}, y^{(k)})$. At step 13, $x^{(k+1)}$ is updated using EQ. (23) for $s = s^{(k)}$, and at step 14, $y^{(k+1)}$ is updated using EQ. (24) for $t = t^{(k)}$. Steps 11 to 14 are repeated for k=0, 1, . . . , until convergence.

Per-Iteration Computation

Steps 13 and 14 can be justified by the following theorem. Theorem 2.2. The solutions of EQS. (20) and (22) are given uniquely by EQS. (23) and (24), respectively.

Proof. First, it is well known that the unique solution of EQ. (20) is soft-thresholding or shrinkage:

$$x*(s) = \begin{cases} s - \tau_1 \beta, & s > \tau_1 \beta, \\ 0, & -\tau_1 \beta \le s \le \tau_1 \beta, \\ s + \tau_1 \beta, & s < -\tau_1 \beta, \end{cases} \quad (25)$$

which is precisely EQ. (23).

Second, it will be proven that EQ. (24) uniquely solves EQ. (22) by showing that, in each of the two cases: $\|t_{ij}\| \le 1/\tau_2$ and $\|t_{ij}\| > 1/\tau_2$, EQ. (24) uniquely satisfies the first-order optimality condition of EQ. (22):

$$0 \epsilon \tau_2 y^*_{ij} + \partial \|y^*_{ij} - t_{ij}\|_2, \quad (26)$$

where $$\partial \|z\|_2 = \begin{cases} \{z/\|z\|_2\} & z \ne 0, \\ \{w : \|w\|_2 \le 1\}, & z = 0. \end{cases} \quad (27)$$

If $\|t_{ij}\| \le 1/\tau_2$, then simple calculations give $\|y^*_{ij} - t_{ij}\|_2 = 0$; hence, $y^*_{ij} = t_{ij}$, which is given by (2.18). If $\|t_{ij}\| > 1/\tau_2$, then $y^*_{ij} = t_{ij}$ does not satisfy EQ. (26), so $\|y^*_{ij} - t_{ij}\|_2 \ne 0$; this, together with EQ. (26), yields $y^*_{ij} - t_{ij}/(\tau_2 \|t_{ij}\|_2)$, which is also given by EQ. (24).

EQS. (23)-(24) can be computed in times linear in the size of x, i.e., in $O(n_1 \times n_2)$. Therefore Steps 13 and 14 are very cheap to compute.

Next, consider the computation of Steps 11 and 12. All finite difference operators $L_{ij}$ and their adjoint $L^*_{ij}$, can be applied in a total of $O(n_1 \times n_2)$ time, so they are not more expensive than the wavelet transform $\Phi$ and Fourier transform R, as well as their inverse transforms. In view of EQS. (17) and (19), both steps involve the computation $\Psi x^{(k)}$ so only one such computation is needed. In addition, only one $\Phi$ is needed in EQ. (17) since the last two terms in EQ. (17) can be combined. Therefore, the total amount of computation in EQS (17) and (19) for each k is dominated by one forward and one inverse transform for the wavelet and Fourier transforms each.

According to an exemplary, non-limiting embodiment of the invention, $s^{(k)}$, $t^{(k)}$, $x^{(k)}$, and $y^{(k)}$ are stored in memory for current k. However, neither R nor $\Phi$ need be explicitly expressed; all matrix-vector multiplications involving them can be computed by, e.g., MATLAB's implementation of the corresponding fast transforms. This keeps the memory requirement manageable.

Convergence and a Continuation Strategy

A 4-step iteration according to an embodiment of the invention is based on splitting the terms in the optimality conditions EQS. (14) and (15) into two parts, one forward (Steps 11 and 12) and one backward (Steps 13 and 14), each of which is very easy to compute. After embedding the variables and operators into appropriate spaces, one can show that the $x^{(k)}$ generated by the iterations converge to a global solution $\bar{x}$ as long as the step sizes $\tau_1$ and $\tau_2$ are small enough. To obtain the bounds on $\tau_1$ and $\tau_2$, one can estimate the spectral radius of certain operators. However, this is not necessary in practice since there are line search strategies for determining appropriate sizes and guarantee convergence.

The objective function of EQ. (7) is convex but not strictly convex. In rare cases, EQ. (7) has more than one solution. When this happens, which one of the solutions is the limit of $x^{(k)}$ depends on the initial point.

Further, the convergence of a 4-step iteration according to an embodiment of the invention can be accelerated by adopting a continuation strategy used for EQ. (4). A splitting-based algorithm can be applied to EQ. (4) and the penalty parameter β varies with k, starting from an initial large value and gradually decreasing to the given value. EQ. (4) is easier to solve with a larger β, and a continuation algorithm is faster because an approximate solution of EQ. (4) corresponding to a larger β serves as a good starting point for the system corresponding to the next and smaller β.

Extensions to Higher Dimensional Spaces

Although the underlying images are assumed by exemplary embodiments of the invention described above to be two dimensional in the discussions above, it is straightforward to extend the theories and methods according to other embodiments of the invention presented above to images in three or higher dimensions. Specifically, one only needs to replace L, R, and Φ by to the higher-dimensional versions of the finite difference, Fourier transform, and wavelet transform operators.

Numerical Experiments

1. Selection of Sampling Matrix

Figure 2:
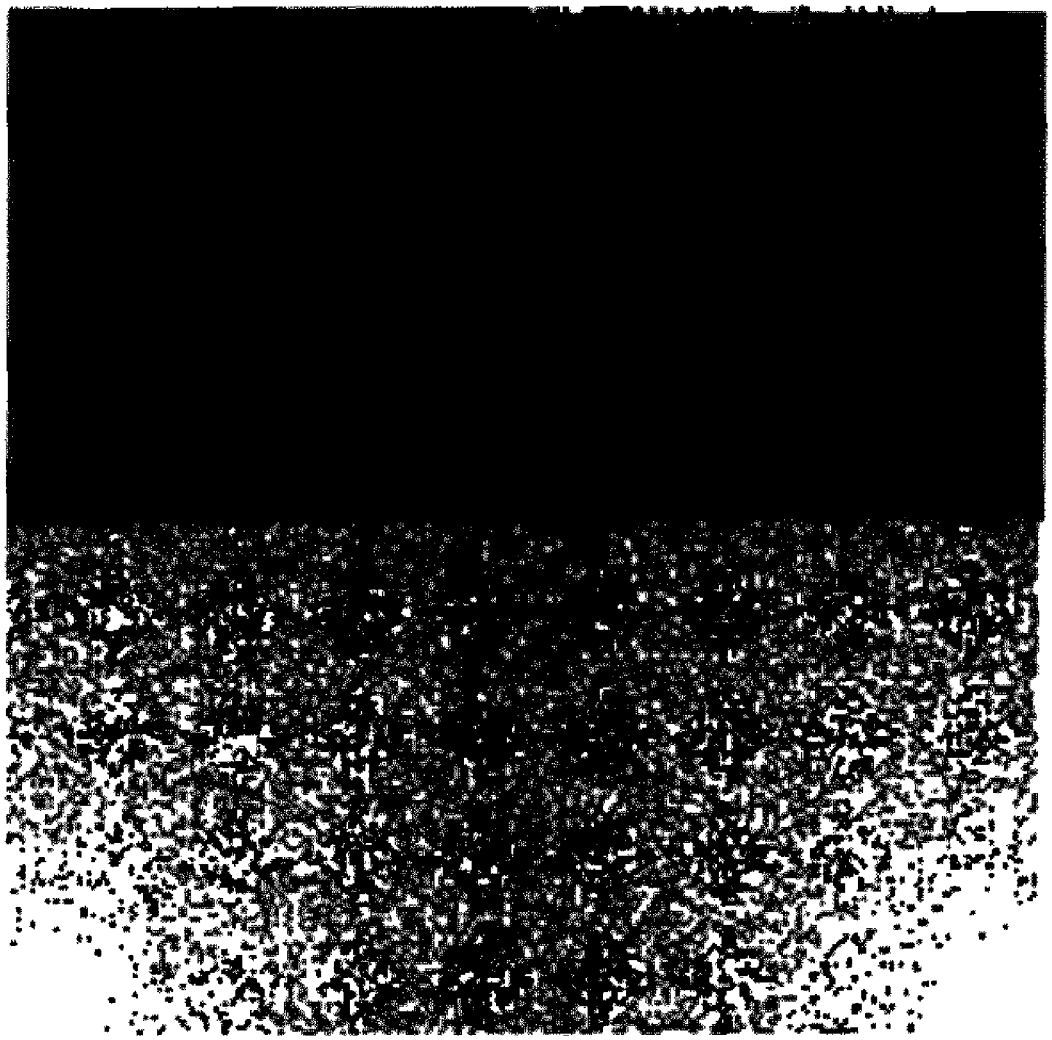
FIG. 2 shows the positions of samplings, highlighted in white, with a 21.53% sampling ratio, according to an embodiment of the invention.

In compressed MR imaging, the sampling matrix A is given by $A=R\Phi^{-1}$, where R is a partial Fourier transform and Φ is the wavelet transform. In numerical experiments of an embodiment of the invention, a Haar wavelet transform was used for simplicity. Assume that an MR image has n pixels, which is represented by an n-dimensional real vector. For example, n equals 1 million for a 1000×1000 pixel image. In an algorithm according to an embodiment of the invention, R includes m rows of the n×n matrix corresponding to the full 2D discrete Fourier transform, where m<<n. (Recall that neither A nor R is stored in memory.) The m selected rows correspond to the selected frequencies at which the measurements in b are collected. The smaller the m, the lesser the amount of time required for an MR scanner to acquire b. The sampling ratio or compression ratio is defined to be m/n. In MR imaging, one has certain freedom to select the rows, however, although these selections are subject to practical constraints, and rows are selected in the following manner. In the k-space, sample more points near the bottom left and bottom right corners, fewer points near the center. Because of the symmetry of the 2D Fourier transform, the upper half space can be masked. Following these guidelines, sampling matrices were randomly created. FIG. 2 highlights in white the positions of the selected frequencies, using a sampling ratio of 21.53%, for one of several experiments in the k-space. It was found that this kind of selection allows recovery of MR images from a much smaller number of samples than a uniformly random selection. In practice, the set of frequencies, as well as the sampling speed, in an MRI scan are constrained by physical and physiological limits, so this sampling strategy is idealized.

2. Experiment Setup

According to an embodiment of the invention, a 2D code, referred to herein below as TVCMRI (Total Variation $l_1$ Compressed MR Imaging), was written in MATLAB based upon the code FPC by Hale et al in "A Fixed-Point Continuation Method for $l_1$-Regularized Minimization with Applications to Compressed Sensing" CAAM Technical Report TR07-07, Jul. 7, 2007, the contents of which are herein incorporated by reference in their entirety, and applied to 2D MR images.

Experiments of embodiments of the invention were carried out in MATLAB v7.3 on a laptop with a 1.66 GHz Intel Core Duo T2300E processor and 2 GB memory. It is to be understood that the use of MATLAB is exemplary and non-limiting, and implementations in other computer languages are within the scope of other embodiments of the invention.

According to an embodiment of the invention, the (final) regularization parameters were set as $\bar{\alpha}=1\times10^{-3}$ and $\bar{\beta}=3.5\times10^{-2}$ in the underlying model of EQ. (6), while, for the continuation procedure in the code, the initial regularization parameters were chosen as $\alpha_0=\bar{\alpha}/(\eta_\alpha^3)$ and $\beta_0=\max\{\eta_\beta \|A^T b\|_\infty, \bar{\beta}\}$ where the rate of reduction in α and β are $\eta_\alpha=0.25$ and $\eta_\beta=0.25$, respectively, i.e., continuation to α and β uses the update scheme $$\alpha_{k+1}=\alpha_k \eta_\alpha,$$

and $$\beta_{k+1}=\beta_k \eta_\beta,$$

until $\bar{\alpha}$ and $\bar{\beta}$ are reached. Both $\tau_1$ and $\tau_2$ are set to 0.8.

For each original MR image $\bar{u} \in R^n$ of n pixels, the observation data b was synthesized as $$b=A\bar{u}+n, \quad (28)$$

where n is Gaussian white noise generated by σ×randn(m, 1) in MATLAB, and $A \in R^{m \times n}$ is the sampling matrix. A and b were given to the code as data, and u was the unknown.

3. Recovered Synthetic Phantom Image

Figure 3:
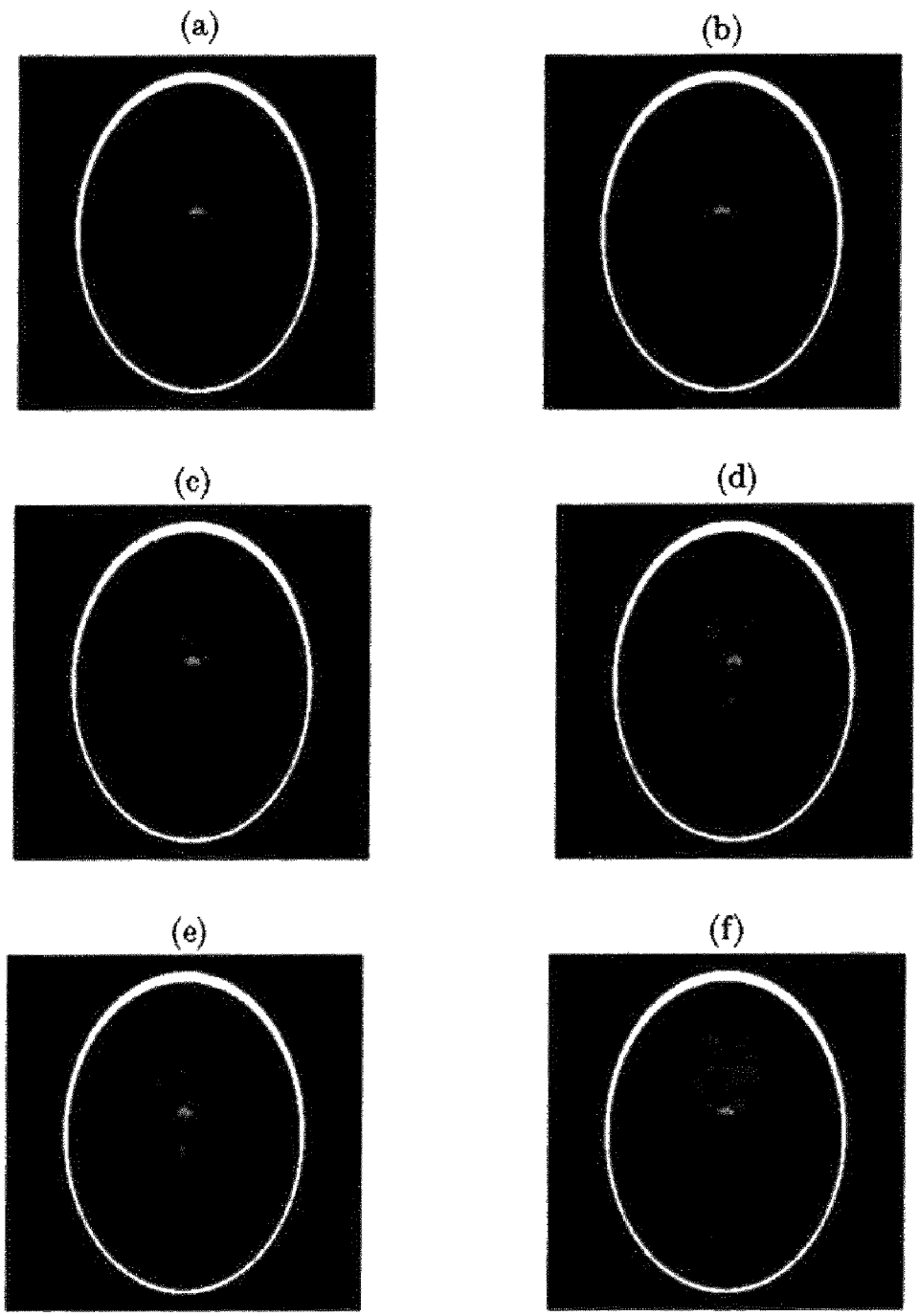
FIGS. 3(a)-(f) depict an original Phantom image and recovered images with the same sampling ratios but different noise levels, according to an embodiment of the invention.

In this subsection, it will be shown that how the noise affects the recovery qualities of a synthetic 256×256 Phantom image. A series of noise levels is provided and the images are recovered by a sampling ratio of 38.56% by a TVCMRI according to an embodiment of the invention. The original and recovered images are shown in FIGS. 3(a)-(f). Referring to the figure, FIG. 3(a) is the original Phantom image, while FIGS. 3(b), (c), (d), (e) and (f) are the recovered images with the same sampling ratios 38.56% but different noise levels σ=0, $10^{-4}$, $10^{-3}$, $10^{-2}$, and $10^{-1}$, respectively. The noise levels σ, relative errors, $$rel.err. = \frac{\|u-\bar{u}\|_2}{\|\bar{u}\|_2}, \quad (29)$$

and running times are given in Table 1, shown in FIG. 4, where ū and u are original and recovered images, respectively.

From FIGS. 3(a)-(f) and Table 1 it can be seen that the recovery by a TVCMRI according to an embodiment of the invention is consistent to noise. When the noise levels are small, one always gets good recovery and the relative errors are almost the same. Even when the noise level is large, σ0:1, one can still obtain get a very clear recovered image with relative error less than the noise level.

4. Recovered Real MR Images

Figure 5:
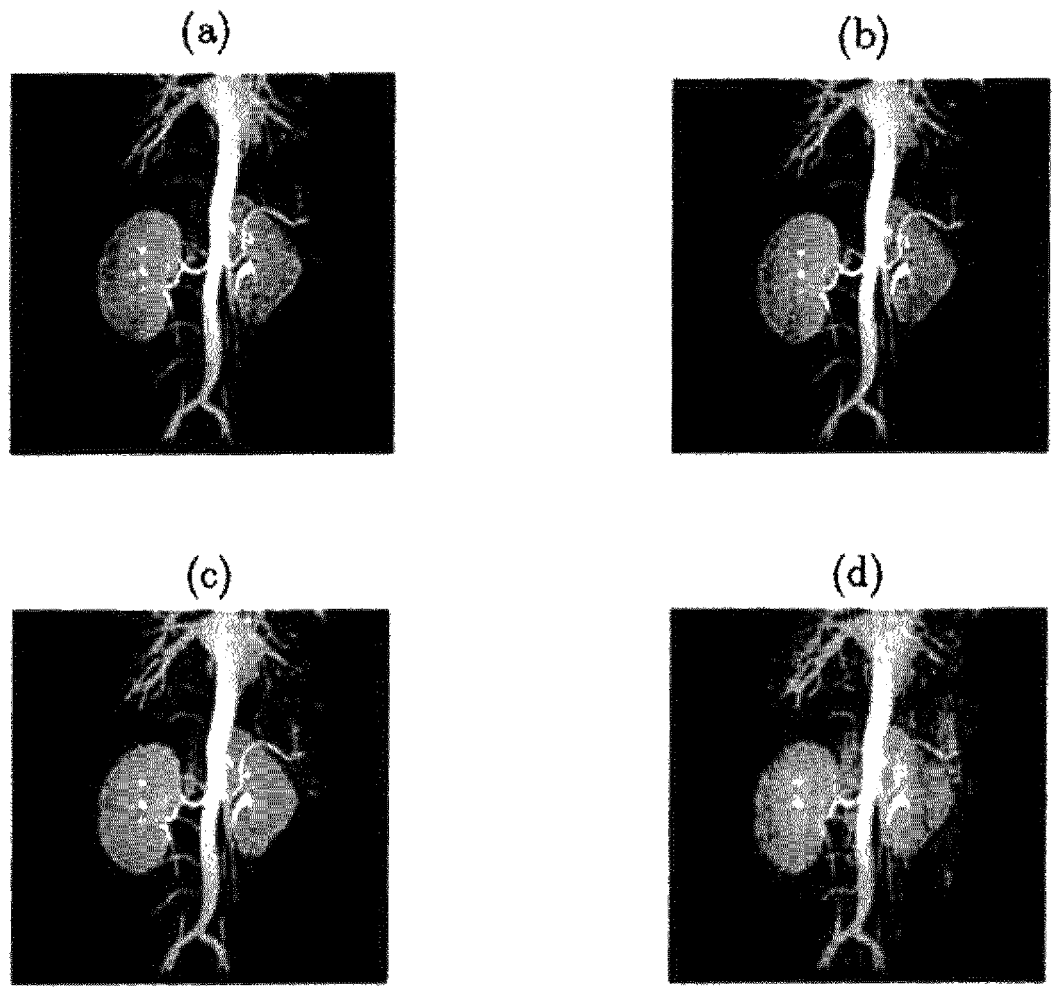
FIGS. 5(a)-(d) depict an original Renal Arteries image and recovered images with different sampling ratios, according to an embodiment of the invention.
Figure 6:
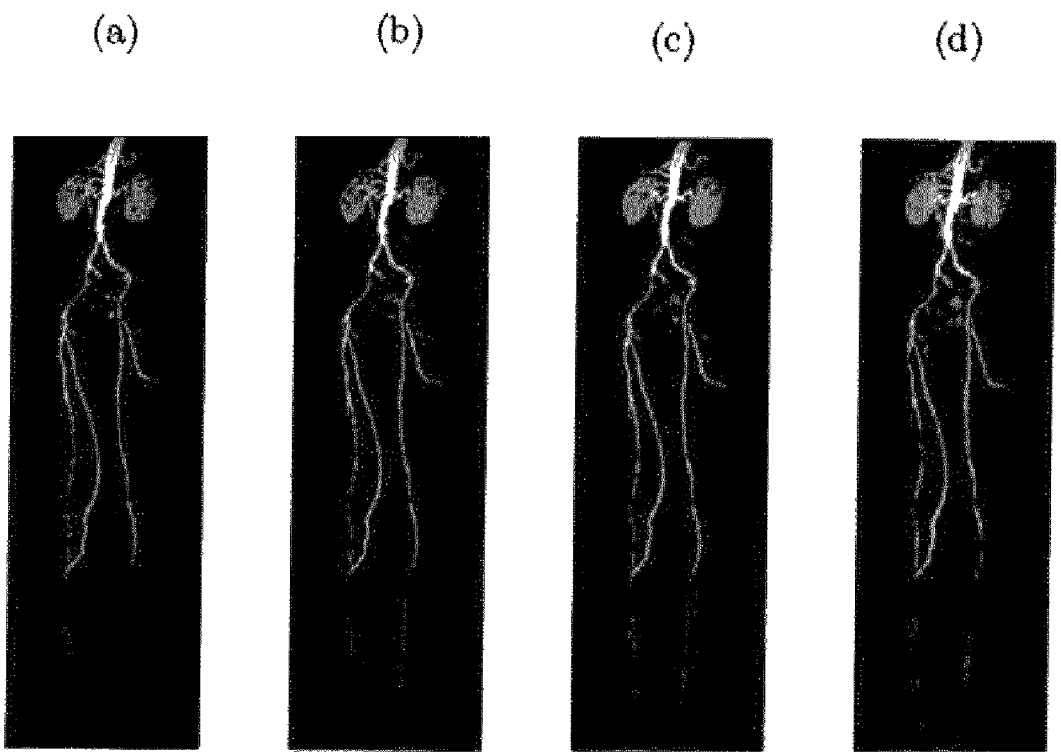
FIGS. 6(a)-(d) depict an original Abdomen Extremities image and recovered images with different sampling ratios, according to an embodiment of the invention.
Figure 7:
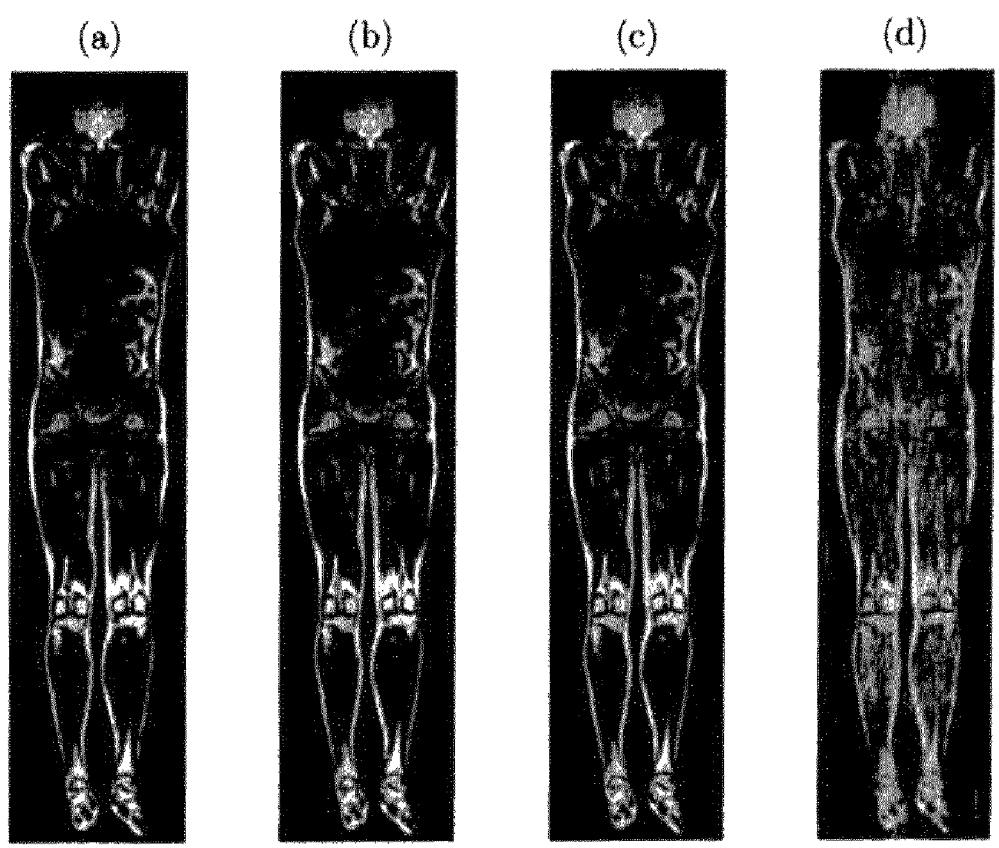
FIGS. 7(a)-(d) depict an original MR Human Full body image and recovered images with different sampling ratios, according to an embodiment of the invention.

This subsection reports numerical results for applying a TVCMRI according to an embodiment of the invention to three real 2D MR images: a 220×220 Renal Arteries image, a 480×150 Abdomen Extremities image, and a 924×208 Human Full Body image. The original and recovered images are shown in FIGS. 5-7. FIG. 5(a) is the original Renal Arteries image, while FIGS. 5(b), (c) and (d) are the recovered images at the sampling ratios of 38.50%, 21.53% and 8.81%, respectively. FIG. 6(a) is the original Abdomen Extremities image, while FIGS. 6(b), (c) and (d) are the recovered images at the sampling ratios of 38.41%, 21.45% and 8.51%, respectively. FIG. 7(a) is the original MR Human Full body image, while FIGS. 7(b), (c) and (d) are the recovered images at the sampling ratios of 38.29%, 21.42%, and 8.28%, respectively.

To demonstrate minimizing total variation in the model of EQ (6), the FPC code was also used to solve EQ. (4) on the same images, in which total variation was not used. The relative errors and running times for these two algorithms are given in Table 2, shown in FIG. 8.

A TVCMRI algorithm according to an embodiment of the invention can efficiently recover the images. For the Renal Arteries and Abdomen Extremities images, a TVCMRI according to an embodiment of the invention can usually recover the image within about 6 seconds. Even for the big Human Full Body image, a TVCMRI according to an embodiment of the invention can still recover the image within 15 seconds. In contrast, the FPC algorithm costs much more time than a TVCMRI algorithm according to an embodiment of the invention. Although the input images have different levels of complexities, the recovery qualities of a TVCMRI according to an embodiment of the invention were consistent across these images. Specifically, for each of them, a sampling ratio of 38% was always sufficient for reconstructing a faithful image; 21% yielded clean images without significant artifacts; yet a very low sampling ratio of 8.7% still gave acceptable results with obvious artifacts. These results can be improved by increasing the number of iterations in the code. Moreover, although slight under-sampling caused minor artifacts, the reconstruction did not fail; this is not the case in classical compressed sensing for sparse signals, where an insufficient number of measurements will yield completely incorrect results.

Figure 9:
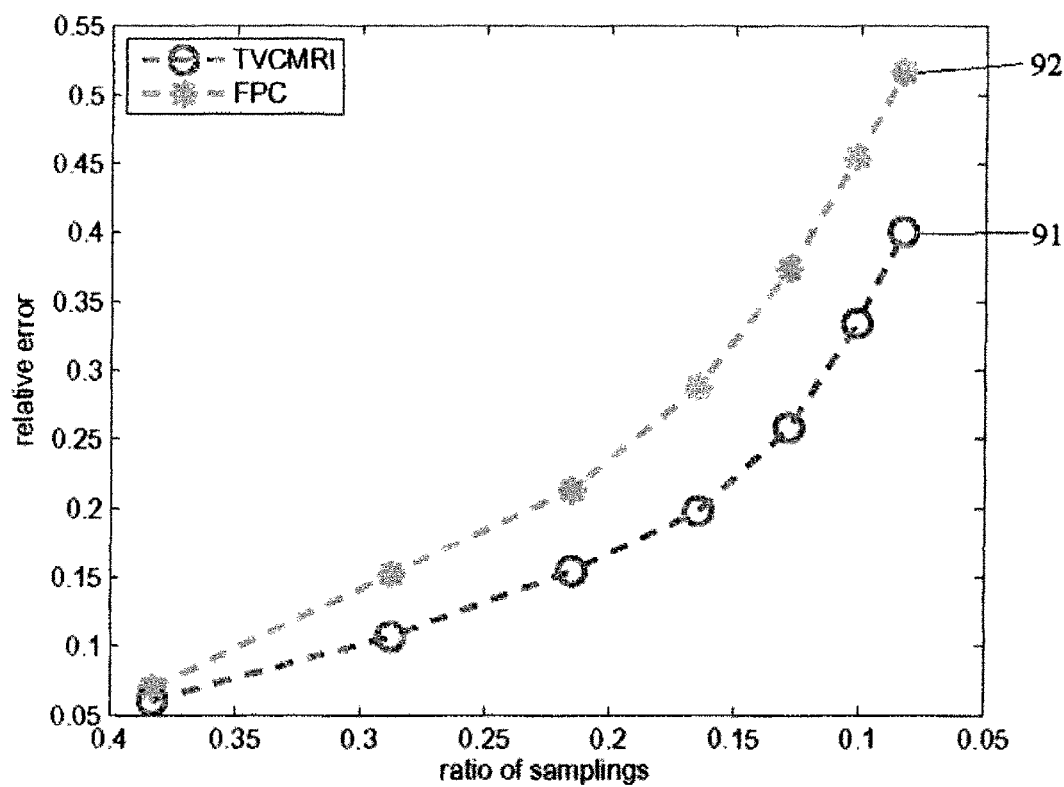
FIG. 9 is a graph of relative errors of TVCMRI and FPC with different sampling ratios for the Human Full Body image, according to an embodiment of the invention.

FIG. 9 is a graph showing the relative errors of the recovered Human Full Body MR images by TVCMRI (curve 91) and FPC (curve 92) from the measurements at a sequence of different sampling ratios. From FIG. 9 it can be seen that the relative errors of the recovered images from a TVCMRI according to an embodiment of the invention, which solves EQ. (6), are much smaller than those from FPC, which solves EQ. (4).

System Implementations

It is to be understood that embodiments of the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

Figure 10:
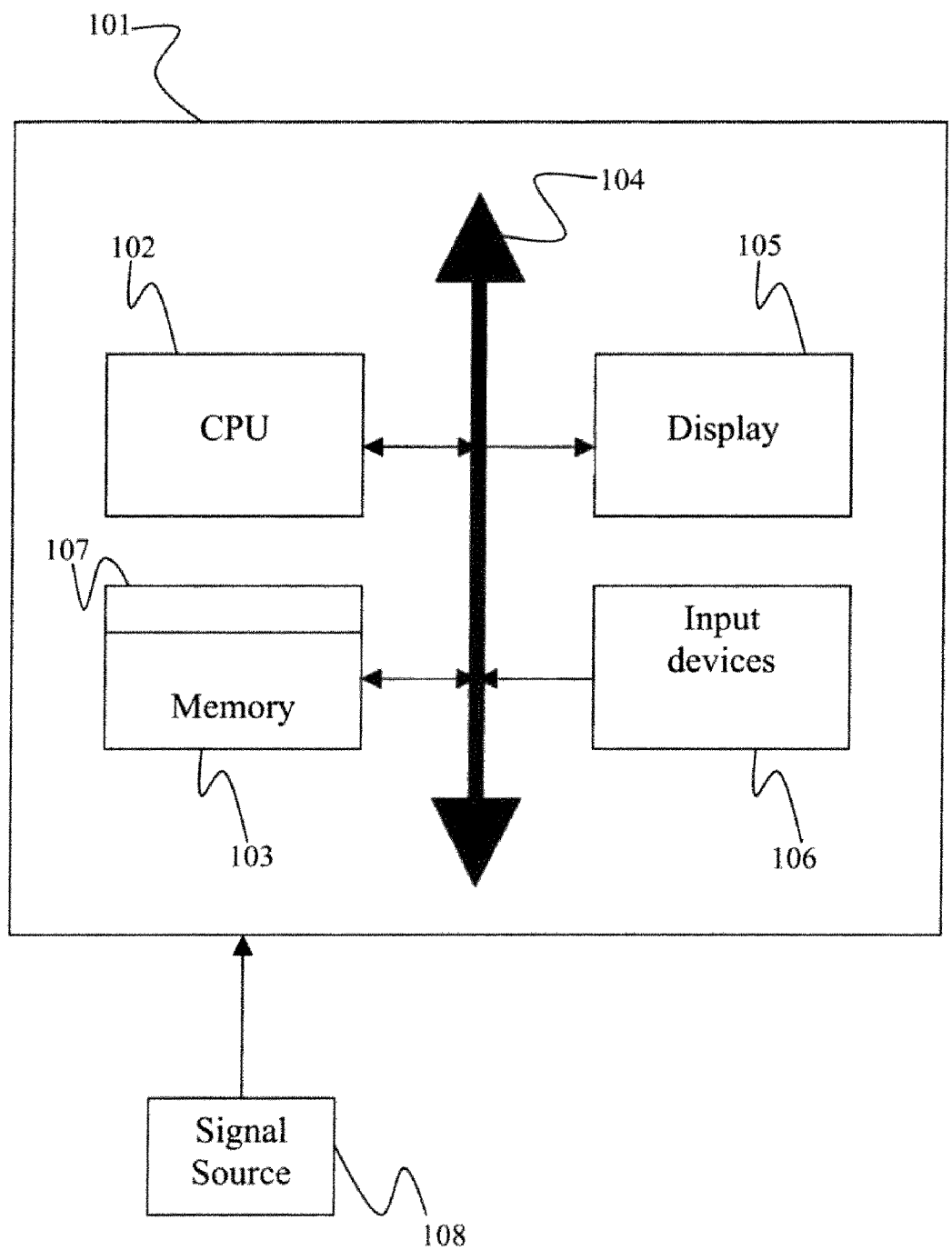
FIG. 10 is a block diagram of an exemplary computer system for implementing a method for compressed sensing reconstruction of magnetic resonance images, according to an embodiment of the invention.

FIG. 10 is a block diagram of an exemplary computer system for implementing a method for compressed sensing reconstruction of magnetic resonance images according to an embodiment of the invention. Referring now to FIG. 10, a computer system 101 for implementing the present invention can comprise, inter alia, a central processing unit (CPU) 102, a memory 103 and an input/output (I/O) interface 104. The computer system 101 is generally coupled through the I/O interface 104 to a display 105 and various input devices 106 such as a mouse and a keyboard. The support circuits can include circuits such as cache, power supplies, clock circuits, and a communication bus. The memory 103 can include random access memory (RAM), read only memory (ROM), disk drive, tape drive, etc., or a combinations thereof. The present invention can be implemented as a routine 107 that is stored in memory 103 and executed by the CPU 102 to process the signal from the signal source 108. As such, the computer system 101 is a general purpose computer system that becomes a specific purpose computer system when executing the routine 107 of the present invention.

The computer system 101 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to a preferred embodiment, those skilled in the art will appreciate that various modifications and substitutions can be made thereto without departing from the spirit and scope of the invention as set forth in the appended claims.

What is claimed is:

1. A computer-implemented method of expanding a sparsely sampled digitized image, the method performed by the computer comprising the steps of:

acquiring a sparse digital image b, said image comprising a plurality of intensities corresponding to an I-dimensional grid of points;

initializing points $(x^{(k)}, y^{(k)})$, wherein $x^{(k)}$ is an initial approximation of a first expanded image $\bar{x}$ recovered from the sparse digital image b and defined by $b = R\Phi^{-1}\bar{x}$, wherein R is a Fourier transform matrix, $\Phi$ is a wavelet transform matrix, $y^{(k)}$ is a point in the set of subgradients $$\partial\left(\sum_{i=1}^{I}(\nabla_i \Phi^{-1} x^{(k)})^2\right)^{1/2},$$

$\nabla_i$ is a forward finite difference operator for an $i^{th}$ coordinate, and k is an iteration counter;

calculating a first auxiliary variable $s^{(k)}$ from $$x^{(k)} - \tau_1\left(\alpha\Phi\sum_n L_n^* y_n^{(k)} + \Phi R * (R\Phi^{-1} x^{(k)} - b)\right),$$

wherein $\tau_1$, $\alpha$ are predetermined positive scalar constants, the sum is over all points n in $\bar{x}$, and $L^*$ is an adjoint of operator $L=(\nabla_1, \ldots, \nabla_I)$;

calculating a second auxiliary variable $t_n^{(k)}$ from $y_n^{(k)} + \tau_2 L_n \Phi^{-1} x^{(k)}$, wherein $\tau_2$ is a predetermined positive scalar constant;

updating $x^{(k+1)}$ from $\text{sign}(s^{(k)})\max\{0, |s^{(k)}| - \tau_1\beta\}$, wherein $\beta$ is a predetermined positive scalar constant, to provide an improved approximation to the first expanded image $\bar{x}$; and updating $y_n^{(k+1)}$ from $$\min\left\{\frac{1}{\tau_2}, \|t_n^{(k)}\|_2\right\}\frac{t_n^{(k)}}{\|t_n^{(k)}\|_2}.$$

2. The method of claim 1, wherein said steps of calculating a first auxiliary variable $s^{(k)}$, calculating a second auxiliary variable $t_n^{(k)}$, updating $x^{(k+1)}$, and updating $y_n^{k+1}$ are repeated until convergence.

3. The method of claim 1, wherein said wavelet transform matrix $\Phi$ is a Haar wavelet transform matrix.

4. The method of claim 1, wherein said Fourier transform matrix R is a non-invertible matrix of size m×n, wherein m is a number of points in image b, n is a number of points in first expanded image $\bar{x}$, and m<<n.

5. The method of claim 4, wherein the m rows of R are selected by sampling more points in Fourier space near bottom corners in said Fourier space, and fewer points approaching a center of said Fourier space, wherein upper half space is masked.

6. The method of claim 2, further comprising constructing a second expanded digitized image $\bar{u}$ from $\bar{u}=\Phi^{-1}\bar{x}$.

7. The method of claim 2, further comprising updating said positive, scalar constants $\alpha,\beta$ from $\alpha_{k+1}=\alpha_k\eta_\alpha$ and $\beta_{k+1}=\beta_k\eta_\beta$, wherein $\eta_\alpha$ and $\eta_\beta$ are predetermined positive, scalar constants, and repeating said steps of calculating a first auxiliary variable $s^{(k)}$, calculating a second auxiliary variable $t_n^{(k)}$, updating $x^{(k+1)}$, and updating $y_n^{(k+1)}$ until convergence.

8. The method of claim 7, further comprising updating said positive, scalar constants $\alpha,\beta$ until $\alpha,\beta$ reach predetermined minimum values.

9. A computer-implemented method of expanding a sparsely sampled digitized image, the method performed by the computer comprising the steps of:

acquiring a sparse digital image b, said image comprising a plurality of intensities corresponding to an I-dimensional grid of points;

providing a wavelet transform matrix $\Phi$;

providing a non-invertible Fourier transform matrix R of size m×n, wherein m is a number of points in image b, n is a number of points in a first expanded image x recovered from the sparse digital image b and defined by $b=R\Phi^{-1}x$, and m<<n;

jointly minimizing an $l_1$ norm, a total variation, and a least squares measure $$\min_x\left(\alpha TV(\Phi^{-1}x)+\beta\|x\|_1+\frac{1}{2}\|Ax-b\|_2^2\right)$$

to solve for x using operator-splitting fixed point iterations, wherein x is said first expanded image, $A=R\Phi^{-1}$, $\alpha$ and $\beta$ are predefined positive parameters, $$TV(u):=\sum_n\left(\sum_i(\nabla_i u_n)^2\right)^{1/2}$$

is a total variation of $\Phi^{-1}x$, wherein the outer sum is over all points in x, the inner sum is over all dimensions, $\nabla_i$ denotes the forward finite difference operators on the $i^{th}$ coordinate; and constructing a second expanded digitized image u from $u=\Phi^{-1}x$, to provide an improved approximation to the first expanded image x.

10. The method of claim 9, wherein said operator-splitting fixed point iterations comprise the steps of:

initializing points $(x^{(k)},y^{(k)})$, wherein $x^{(k)}$ is an initial approximation of the first expanded image x, $y^{(k)}$ is a point in the set of subgradients $$\partial\left(\sum_{i=1}^I(\nabla_i\Phi^{-1}x^{(k)})^2\right)^{1/2},$$

and k is an iteration counter;

calculating a first auxiliary variable $s^{(k)}$ from $$x^{(k)}-\tau_1\left(\alpha\Phi\sum_n L_n^* y_n^{(k)}+\Phi R*(R\Phi^{-1}x^{(k)}-b)\right),$$

wherein $\tau_1,\alpha$ are predetermined positive scalar constants, the sum is over all points n in $\bar{x}$, and L* is an adjoint of operator $L=(\nabla_1,\ldots,\nabla_I)$;

calculating a second auxiliary variable $t_n^{(k)}$ from $y_n^{(k)}+\tau_2 L_n\Phi^{-1}x^{(k)}$, wherein $\tau_2$ is a predetermined positive scalar constant;

updating $x^{(k+1)}$ from $\text{sign}(s^{(k)})\max\{0,|s^{(k)}|-\tau_1\beta\}$, wherein $\beta$ is a predetermined positive scalar constant; and updating $y_n^{(k+1)}$ from $$\min\left\{\frac{1}{\tau_2},\|t_n^{(k)}\|_2\right\}\frac{t_n^{(k)}}{\|t_n^{(k)}\|_2}.$$

11. A non-transitory program storage device readable by a computer, tangibly embodying a program of instructions executable by the computer to perform the method steps for expanding a sparsely sampled digitized image, said method comprising the steps of:

acquiring a sparse digital image b, said image comprising a plurality of intensities corresponding to an I-dimensional grid of points;

initializing points $(x^{(k)},y^{(k)})$, wherein $x^{(k)}$ is an initial approximation of a first expanded image $\bar{x}$ recovered from the sparse digital image b and defined by $b=R\Phi^{-1}\bar{x}$, wherein R is a Fourier transform matrix, $\Phi$ is a wavelet transform matrix, $y^{(k)}$ is a point in the set of subgradients $$\partial\left(\sum_{i=1}^I(\nabla_i\Phi^{-1}x^{(k)})^2\right)^{1/2},$$

$\nabla_i$ is a forward finite difference operator for an $i^{th}$ coordinate, and k is an iteration counter;

calculating a first auxiliary variable $s^{(k)}$ from $$x^{(k)}-\tau_1\left(\alpha\Phi\sum_n L_n^* y_n^{(k)}+\Phi R*(R\Phi^{-1}x^{(k)}-b)\right),$$

wherein $\tau_1,\alpha$ are predetermined positive scalar constants, the sum is over all points n in $\bar{x}$, and L* is an adjoint of operator $L=(\nabla_1,\ldots,\nabla_I)$;

calculating a second auxiliary variable $t_n^{(k)}$ from $y_n^{(k)}+\tau_2 L_n\Phi^{-1}x^{(k)}$, wherein $\tau_2$ is a predetermined positive scalar constant;

updating $x^{(k+1)}$ from $\text{sign}(s^{(k)})\max\{0,|s^{(k)}|-\tau_1\beta\}$, wherein $\beta$ is a predetermined positive scalar constant, to provide an improved approximation to the first expanded image $\bar{x}$; and updating $y_n^{(k+1)}$ from $$\min\left\{\frac{1}{\tau_2},\|t_n^{(k)}\|_2\right\}\frac{t_n^{(k)}}{\|t_n^{(k)}\|_2}.$$

12. The computer readable program storage device of claim 11, wherein said steps of calculating a first auxiliary variable $s^{(k)}$, calculating a second auxiliary variable $t_n^{(k)}$, updating $x^{(k+1)}$, updating $y_n^{(k+1)}$ are repeated until convergence.

13. The computer readable program storage device of claim 11, wherein said wavelet transform matrix $\Phi$ is a Haar wavelet transform matrix.

14. The computer readable program storage device of claim 11, wherein said Fourier transform matrix R is a non-invertible matrix of size m×n wherein m is a number of points in image b, n is a number of points in first expanded image $\bar{x}$, and m<<n.

15. The computer readable program storage device of claim 14, wherein the m rows of R are selected by sampling more points in Fourier space near bottom corners in said Fourier space, and fewer points approaching a center of said Fourier space, wherein an upper half space is masked.

16. The computer readable program storage device of claim 12, the method further comprising constructing a second expanded digitized image $\bar{u}$ from $\bar{u}=\Phi^{-1}\bar{x}$.

17. The computer readable program storage device of claim 12, the method further comprising updating said positive, scalar constants $\alpha,\beta$ from $\alpha_{k+1}=\alpha_k\eta_\alpha$ and $\beta_{k+1}=\beta_k\eta_\beta$, wherein $\eta_\alpha$ and $\eta_\beta$ are predetermined positive, scalar constants, and repeating said steps of calculating a first auxiliary variable $s^{(k)}$, calculating a second auxiliary variable $t_n^{(k)}$, updating $x^{(k+1)}$, and updating $y_n^{(k+1)}$ until convergence.

18. The computer readable program storage device of claim 17, the method further comprising updating said positive, scalar constants $\alpha,\beta$ until $\alpha,\beta$ reach predetermined minimum values.

* * * * *